United States Patent
Lii et al.

(10) Patent No.: US 8,169,076 B2
(45) Date of Patent: May 1, 2012

(54) INTERCONNECT STRUCTURES HAVING LEAD-FREE SOLDER BUMPS

(75) Inventors: Mirng-Ji Lii, Hsin-Chu (TW);
Chien-Hsiun Lee, Hsin-Chu (TW);
Chen-Hua Yu, Hsin-Chu (TW);
Shin-Puu Jeng, Hsin-Chu (TW);
Chin-Yu Ku, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 371 days.

(21) Appl. No.: 12/537,001

(22) Filed: Aug. 6, 2009

(65) Prior Publication Data
US 2010/0314756 A1 Dec. 16, 2010

Related U.S. Application Data

(60) Provisional application No. 61/187,542, filed on Jun. 16, 2009.

(51) Int. Cl.
*H01L 23/498* (2006.01)
(52) U.S. Cl. ......... 257/737; 257/E23.068; 257/E23.141; 257/738; 257/778; 257/780
(58) Field of Classification Search .................. 257/737, 257/738, 778, 779, 780, 781, 782, 784, 786, 257/E23.068, E23.141, E23.069
See application file for complete search history.

(56) References Cited

U.S. PATENT DOCUMENTS

| | | | | |
|---|---|---|---|---|
| 7,531,417 | B2 * | 5/2009 | Lin | 438/381 |
| 7,656,042 | B2 * | 2/2010 | Lii et al. | 257/778 |
| 7,838,954 | B2 * | 11/2010 | Buchwalter et al. | 257/437 |
| 7,892,963 | B2 * | 2/2011 | Yeo et al. | 438/622 |
| 7,969,006 | B2 * | 6/2011 | Lin et al. | 257/758 |
| 7,982,313 | B2 * | 7/2011 | Grillberger et al. | 257/758 |
| 8,018,060 | B2 * | 9/2011 | Lin et al. | 257/758 |
| 8,035,218 | B2 * | 10/2011 | Guzek et al. | 257/700 |
| 2006/0051954 | A1 * | 3/2006 | Lin et al. | 438/614 |
| 2006/0286791 | A1 * | 12/2006 | Feng | 438/613 |
| 2007/0015312 | A1 * | 1/2007 | Tsai | 438/106 |
| 2007/0181218 | A1 * | 8/2007 | Sakamoto et al. | 148/25 |
| 2007/0181979 | A1 * | 8/2007 | Beer et al. | 257/619 |
| 2009/0261473 | A1 * | 10/2009 | Lee et al. | 257/738 |
| 2011/0079895 | A1 * | 4/2011 | Lu et al. | 257/737 |
| 2011/0186989 | A1 * | 8/2011 | Hsiao et al. | 257/737 |

* cited by examiner

*Primary Examiner* — A O Williams
(74) *Attorney, Agent, or Firm* — Slater & Matsil, L.L.P.

(57) ABSTRACT

An integrated circuit structure includes a semiconductor substrate, and a polyimide layer over the semiconductor substrate. An under-bump-metallurgy (UBM) has a first portion over the polyimide layer, and a second portion level with the polyimide layer. A first solder bump and a second solder bump are formed over the polyimide layer, with a pitch between the first solder bump and the second solder bump being no more than 150 μm. A width of the UBM equals one-half of the pitch plus a value greater than 5 μm.

20 Claims, 1 Drawing Sheet

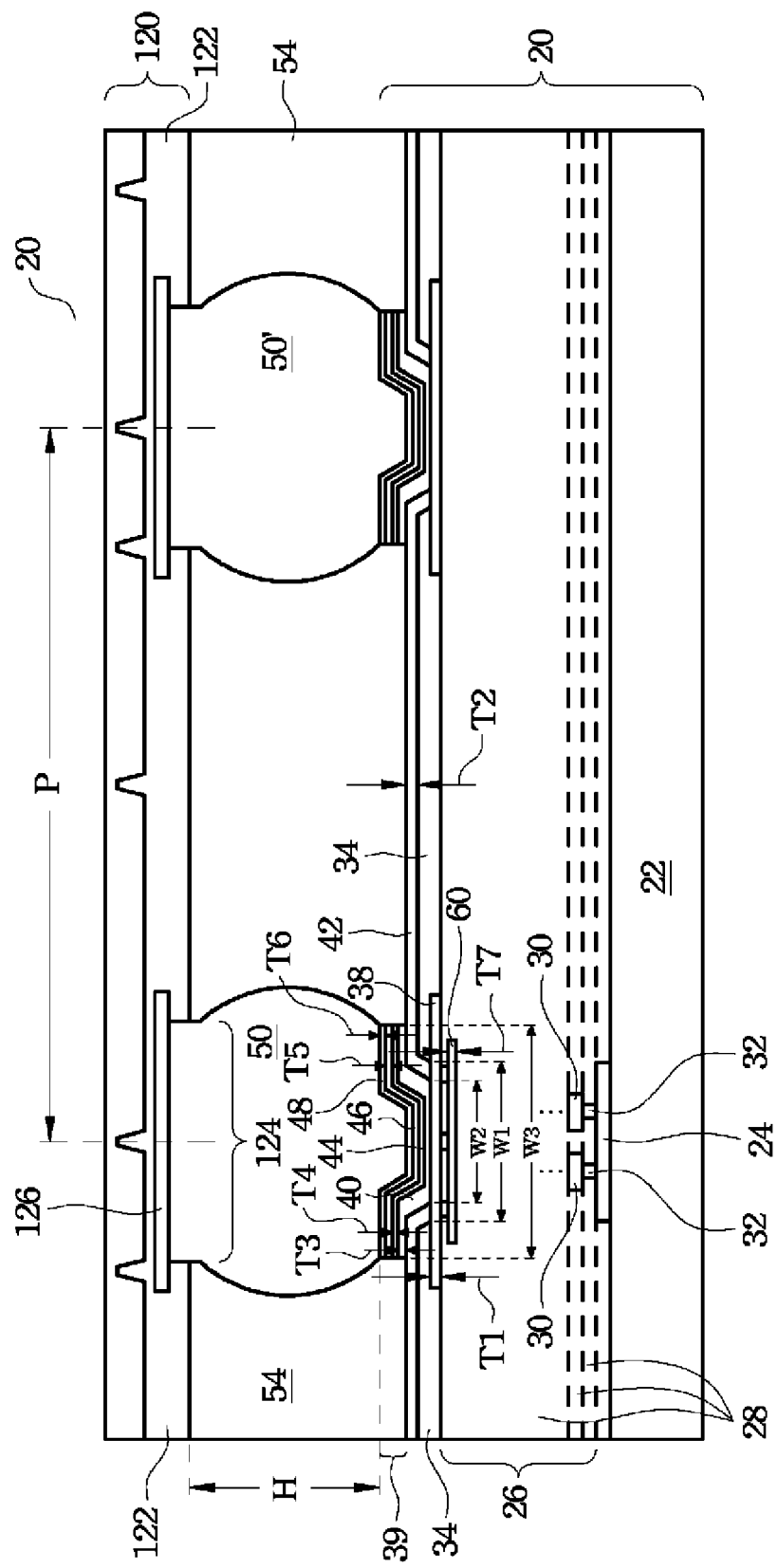

INTERCONNECT STRUCTURES HAVING LEAD-FREE SOLDER BUMPS

This application claims the benefit of U.S. Provisional Application No. 61/187,542 filed on Jun. 16, 2009, entitled "Interconnect Structures Having Lead-Free Solder Bumps," which application is hereby incorporated herein by reference.

TECHNICAL FIELD

This invention relates generally to integrated circuits, and more particularly to the structure and formation methods of bonding structures of integrated circuits.

BACKGROUND

Integrated circuit (IC) chips are often electrically connected to package substrates in packaging assemblies to provide external signal exchange. A commonly used bonding scheme is flip-chip bonding. Flip-chips provide the most rugged mechanical interconnection. When underfilled with an adhesive, such as an epoxy, flip-chips can withstand rugged durability tests. Additionally, flip-chip bonding is a low-cost interconnection scheme suitable for high-volume automated production.

Flip-chips are typically made by placing solder bumps on silicon chips. In a conventional interconnection structure, dielectric layers are first formed over a silicon substrate. Metal lines and vias are formed in the dielectric layers. A metal pad is formed over the dielectric layers. A passivation layer is formed on the metal pad, with an opening in the dielectric layers to expose the metal pad. A polyimide buffer layer may then be formed. In the opening, an under-bump-metallurgy (UMB), a titanium layer, a plated copper layer, and a plated nickel layer are formed, followed by the formation of a solder bump.

Conventionally, eutectic solder materials containing lead and tin were used in the solder bumps. A commonly used lead-containing eutectic solder has about 63% tin and 37% lead. This combination gives the solder material a suitable melting temperature and a low electrical resistivity. However, lead is a toxic material, and legislation and industry requirements have demanded lead-free solder bumps. Companies in the supply chain of the electronics interconnection industry are thus actively seeking to replace eutectic solders. Unfortunately, the commonly known lead-free solders, such as Sn—Ag and Sn—Ag—Cu, are too brittle, and suffer from cracking Further, the lead-free bumps are rigid, and could induce delamination and cracking in dielectric layers.

Bump cracking and delamination in dielectric layers are typically generated by stresses. The coefficient of thermal expansion (CTE) mismatch between materials in the package assembly is one of the main reasons causing the stresses. For example, silicon substrates typically have CTEs of about 3 ppm/° C., low-k dielectrics typically have CTEs of about 20 ppm/° C., while package substrates typically have CTEs of about 17 ppm/° C. The significant difference between CTEs results in stresses when thermal change occurs.

In integrated circuits formed using advanced technologies, the bump cracking and ELK delamination in low-k materials become more severe. For example, in 40 nm technology and below, the bump cracking and delamination in low-k dielectric layers are so severe that the respective integrated circuits cannot even pass reliability tests. This prevents the use of extra low-k (ELK) and ultra low-k (ULK) dielectric materials in the dielectric layers. Therefore, conventionally, no integrated circuits with the combination of ELK/ULK dielectric layers and lead-free bumps were successfully manufactured using 40 nm technology and below.

SUMMARY OF THE INVENTION

In accordance with one aspect of the embodiment, an integrated circuit structure includes a semiconductor substrate, and a polyimide layer over the semiconductor substrate. An under-bump-metallurgy (UBM) has a first portion over the polyimide layer, and a second portion level with the polyimide layer. A first solder bump and a second solder bump are formed over the polyimide layer, with a pitch between the first solder bump and the second solder bump being no more than 150 µm. A width of the UBM equals a half of the pitch plus a value greater than 5.

Other embodiments are also disclosed.

The advantageous features of the embodiments include improved reliability and high manufacture yield.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a cross-sectional view of a flip-chip package assembly in accordance with an embodiment.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

FIG. 1 illustrates a cross-sectional view of a portion of chip (or wafer) 20, which includes substrate 22, on which active circuit 24 is formed. Chip/wafer 20 is bonded to package substrate 120 through solder bumps 50 and 50'. Substrate 22 may be a semiconductor substrate formed of commonly used semiconductor materials, such as silicon, silicon germanium, or the like. Active circuit 24, which is symbolized using a rectangle, is formed at the surface of substrate 22, and may include complementary metal-oxide-semiconductor (CMOS) transistors, resistors, capacitors, and the like. Interconnect structure 26 is formed over active circuit 24, and is used to interconnect the devices inside active circuit 24, and to connect active circuit 24 to overlying solder bumps 50 and 50'. Interconnect structure 26 includes a plurality of metallization layers comprising dielectric layers 28, and metal lines 30 and vias 32 in dielectric layers 28. Interconnect structure 26 includes a top metallization layer comprising metal lines. The top metallization layer is the metallization layer immediately underlying metal pad 38. In an embodiment, metal line 60 in the top metallization layer has thickness T7 greater than about 0.9 µm. Metal line 60 and metal pad 38 may be connected through vias.

In an embodiment, dielectric layers 28 are formed of low-k dielectric materials with dielectric constants (k value) between about 2.9 and 3.8, and hence dielectric layers 28 are also low-k dielectric layers. In other embodiments, dielectric layers 28 are formed of ultra low-k (ULK) dielectric materials, for example, with k values less than about 2.5, and hence dielectric layers 28 are also ULK layers. In yet other embodiments, dielectric layers 28 are formed of extra low-k (ELK) dielectric materials, for example, with k values between about 2.5 and about 2.9, and hence dielectric layers 28 are also ELK layers. With the decrease in k values, dielectric layers 28 become more fragile and are more likely to subject to delamination and cracking Passivation layer(s) 34 is formed over interconnect structure 26. Passivation layer(s) 34 may be formed of dielectric materials, such as silicon oxide, silicon nitride, un-doped silicate glass (USG), silicon oxynitride, combinations thereof, and/or multi-layers thereof. Metal pad 38 is formed in passivation layer(s) 34. In an exemplary embodiment, passivation layer(s) 34 includes two layers (not shown), which may be referred to as passivation-1, and passivation-2 over passivation-1, with metal pad 38 being in passivation-1 and lower than passivation-2. Metal pad 38 is exposed through an opening in an upper portion (for example, passivation-2) of passivation layer(s) 34. Metal pad 38 may be formed of aluminum, and hence may also be referred to as aluminum pad 38, although it may also be formed of, or include, other metallic materials, such as copper, silver, gold, nickel, tungsten, alloys thereof, and/or multi-layers thereof. Metal pad 38 may be electrically connected to active circuit 24, for example, through underlying interconnection structure 26. At the time metal pad 38 is formed, redistribution lines (RDLs), which may be in a same level as metal pad 38, may also be formed using a same process. Metal pad 38 has thickness T1. In an embodiment, thickness T1 is between about 1.4 μm and 15 μm.

A first opening is formed in passivation layer 34(s), with metal pad 38 exposed through the first opening. The width of the first opening in passivation layer(s) 34 is denoted as W1. In an embodiment, buffer layer 42 is formed over passivation layer 34(s), with a portion of buffer layer 42 extending into the first opening, and another portion of buffer layer 42 over passivation layer(s) 34. Buffer layer 42 may be formed of polyimide, although it may also be formed of other less rigid dielectric materials. A second opening is formed in buffer layer 42, with the width of the second opening in buffer layer 42 being denoted as width W2. In an embodiment, width W2 is less than 40 μm. The thickness of buffer layer 42 is shown as T2. In an embodiment, thickness T2 is greater than 5 μm.

Under-bump metallurgy (UBM) 39 is then formed over buffer layer 42, with a portion of UBM 39 in the second opening and electrically connected to metal pad 38. In an embodiment, UBM 39 comprises a plurality of layers, for example, a seed layer including titanium layer 40 and copper layer 44, plated copper layer 46, and plated nickel layer 48. In other embodiments, UBM 39 may include other metals such as gold. UBM 39 has width W3, which is related to pitch P of solder bumps 50 and 50'. In an embodiment, width W3 may be expressed as 0.5P+M, wherein value M is greater than 5 μm. Further, width W2 of the second opening in buffer layer 42 may be less than 50 percent, and may be equal to about 35 percent and about 50 percent, of width W3 of UBM 39.

Titanium layer 40 may have thickness T3, and may be formed of physical vapor deposition (PVD), for example). Copper layer 44 may have thickness T4 and may be formed of PVD, for example). UMB 39 may further include plated copper layer 46 (with thickness T5) over seed layer 44, and plated nickel layer 48 (with thickness T6) over plated copper layer 46. Seed layer 40/44, plated copper layer 46, and plated nickel layer 48 may be blanket formed, and then patterned using a same mask or photo resist. In an embodiment, thickness T3 is about 0.1 μm, thickness T4 is about 0.5 μm, thickness T5 is less than 5 μm, and thickness T6 is less than 3 μm.

Solder bump 50 is formed over and contacting UBM 39. Solder bump 50 may be formed of a lead-free solder comprising SnAg, SnAgCu, or the like, for example. Silver (Ag) may have a weight percentage between about 1 percent to about 2.2% in solder bump 50. After a reflow is performed on solder bump 50, solder bump 50 has a spherical shape, with the size and the shape of the lower portion being defined by the size and the shape of the plurality of metallic layers 40/44/46/48. The pitch between solder bump 50 and neighboring solder bump 50', which has a substantially identical structure as solder bump 50, is denoted as pitch P. Pitch P is preferably no more than 150 μm. In an embodiment, bump height H may be expressed as 0.5P+N, wherein value N is greater than 5 μm, and may be between 5 μm and about 10 μm.

Chip/wafer 20 is bonded onto package substrate 120 through solder bumps 50 and 50'. Package substrate 120 may include dielectric layer 122, with solder resist opening (SRO) 124 in dielectric layer 122. Further, metal pad 126 is exposed through SRO 124. When chip/wafer 20 is bonded to package substrate 120, solder bump 50 is reflowed to join metal pad 126. After the reflow, underfill 54 may be filled into the gap between chip/wafer 20 and package substrate 120. In an embodiment, underfill 54 has a glass transition temperature (Tg) higher than 70° C., or even higher than about 85° C., or even between about 85° C. and about 120° C.

Experiment results have revealed that the reliability of the structure as shown in FIG. 1 is sensitive to parameters of the structure, including dimensions such as thicknesses T1 through T7, pitch P, the widths W1 through W3, bump height H, and glass transition temperature Tg of underfill 54. If the conventional values of these parameters are used (wherein the conventional values were used in the structures in which dielectric layers 28 are formed of silicon oxide), the resulting structure as shown in FIG. 1 cannot pass reliability tests, and the structure will fail after about 200 to 500 thermal cycles. Further, the manufacture yield is also low.

The experiment results also revealed that if, and only if, each of the above-discussed parameters, including thickness T1 through T7, pitch P, widths W1 through W3, bump height H, and glass transition temperature Tg is in a small range (as provided in preceding paragraphs), the structure as shown in FIG. 1 may pass reliability tests. Otherwise, the lead-free solder bump 50 may break, and the ELK/ULK dielectric layers 28 may delaminate. Further, the desirable ranges of these parameters have to be combined. If only some of the parameters are inside the desirable ranges, while others are not, the resulting structures may not be able to pass the reliability tests. Inside the combination of ranges, the structure as shown in FIG. 1 may endure more than one thousand thermal cycles as compared to about 200 to 500 thermal cycles if the values of the parameters are outside of the desirable ranges.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a semiconductor substrate;
   a polyimide layer over the semiconductor substrate;
   an under-bump-metallurgy (UBM) comprising a first portion over the polyimide layer, and a second portion level with the polyimide layer; and
   a first solder bump and a second solder bump over the UBM, with a pitch between the first solder bump and the second solder bump being no more than 150 µm, wherein a first width of the UBM equals one-half of the pitch plus a value greater than 5 µm.

2. The integrated circuit structure of claim 1, wherein the first solder bump and the second solder bump have a bump height equal to one-half of the pitch plus an additional value between 5 µm and about 10 µm.

3. The integrated circuit structure of claim 1, wherein the polyimide layer comprises an opening having a second width, with the UBM extending into the opening, and wherein the second width is between about 35 percent and about 50 percent of the first width.

4. The integrated circuit structure of claim 1, wherein the first solder bump and the second solder bump comprise silver, with a weight percentage of silver in the first solder bump and the second solder bump being between about 1% and about 2.2%.

5. The integrated circuit structure of claim 1 further comprising a plurality of dielectric layers between the semiconductor substrate and the UBM, wherein the plurality of dielectric layers is formed of extreme low-k (ELK) dielectric materials having k values between about 2.5 and about 2.9.

6. The integrated circuit structure of claim 1 further comprising a plurality of dielectric layers between the semiconductor substrate and the UBM, wherein the plurality of dielectric layers is formed of ultra low-k (ULK) dielectric materials having k values less than about 2.5.

7. The integrated circuit structure of claim 1 further comprising:
   a passivation layer underlying the polyimide layer, wherein the polyimide layer and the passivation layer comprise different materials; and
   a metal pad under a portion of the passivation layer and electrically connected to the UBM through an opening in the polyimide layer.

8. The integrated circuit structure of claim 1, wherein the UBM comprises:
   a seed layer;
   a plated copper layer over and contacting the seed layer and having a thickness less than 5 µm; and
   a plated nickel layer over and contacting the plated copper layer and having a thickness less than 3 µm.

9. The integrated circuit structure of claim 1 further comprising an underfill between the first solder bump and the second solder bump, wherein the underfill has a glass transition temperature between about 85° C. and about 120° C.

10. The integrated circuit structure of claim 1 further comprising a package substrate bonded with the first solder bump and the second solder bump.

11. An integrated circuit structure comprising:
    a semiconductor substrate;
    a metal pad over the semiconductor substrate;
    a passivation layer having at least a portion over the metal pad, and wherein the metal pad is exposed through a first opening;
    a polyimide layer over the passivation layer and extends into the first opening, wherein the polyimide layer comprises a second opening with a width less than 40 µm, and wherein the metal pad is exposed through the second opening;
    an under-bump-metallurgy (UBM) comprising a first portion in the second opening, and a second portion over the polyimide layer, wherein the UBM comprises:
      a seed layer over and contacting the metal pad;
      a plated copper layer over a titanium layer and having a thickness less than 5 µm; and
      a plated nickel layer over the plated copper layer and having a thickness less than 3 µm;
    a first solder bump over and contacting the plated nickel layer; and
    a second solder bump adjacent the first solder bump, with a pitch between the first solder bump and the second solder bump being no more than 150 µm, wherein a first width of the UBM equals one-half of the pitch plus a value greater than 5 µm, and wherein the first solder bump and the second solder bump have a bump height equal to one-half of the pitch plus an additional value between 5 µm and about 10 µm.

12. The integrated circuit structure of claim 11, wherein the second opening has a second width, and wherein the second width is between about 35 percent and about 50 percent of the first width.

13. The integrated circuit structure of claim 11, wherein the first solder bump and the second solder bump comprise silver, with a weight percentage of silver in the first solder bump and the second solder bump being between about 1% and about 2.2%.

14. The integrated circuit structure of claim 11 further comprising a plurality of dielectric layers between the semiconductor substrate and the UBM, wherein the plurality of dielectric layers is formed of extreme low-k dielectric materials having k values between about 2.5 and about 2.9.

15. The integrated circuit structure of claim 11 further comprising a plurality of dielectric layers between the semiconductor substrate and the UBM, wherein the plurality of dielectric layers is formed of ultra low-k (ULK) dielectric materials having k values less than about 2.5.

16. The integrated circuit structure of claim 11 further comprising an underfill between the first solder bump and the second solder bump, wherein the underfill has a glass transition temperature between about 85° C. and about 120° C.

17. The integrated circuit structure of claim 11 further comprising a package substrate bonded with the first solder bump and the second solder bump.

18. The integrated circuit structure of claim 11, wherein the passivation layer comprises a material selected from the group consisting essentially of silicon nitride, silicon oxide, silicon oxynitride, and combinations thereof.

19. The integrated circuit structure of claim 1, wherein the first solder bump and the second solder bump are in physical contact with the first portion and the second portion, respectively, of the UBM.

20. The integrated circuit structure of claim 11, wherein the passivation layer and the polyimide layer comprise different materials.

* * * * *